(12) United States Patent
Chou et al.

(10) Patent No.: US 6,734,525 B2
(45) Date of Patent: May 11, 2004

(54) LOW STRESS INTEGRATED CIRCUIT FUSIBLE LINK

(75) Inventors: Chieh-Chih Chou, Jubei (TW); Jiun-Pyng You, Ilan (TW); Yu-Ching Chang, Hsinchu (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/144,014

(22) Filed: May 13, 2002

(65) Prior Publication Data

US 2003/0209777 A1 Nov. 13, 2003

(51) Int. Cl.[7] .............................................. H01L 29/00
(52) U.S. Cl. ..................... 257/529; 257/173; 257/209; 257/665; 438/132; 438/467; 438/600; 102/202.4
(58) Field of Search ................................. 257/173, 529, 257/209, 665, 910, E21.592, E23.149; 102/202.4; 438/132, 467, 600, 601

(56) References Cited

U.S. PATENT DOCUMENTS 6,323,111 B1 * 11/2001 Hui et al. ................... 438/467

* cited by examiner

*Primary Examiner*—Nathan J. Flynn
*Assistant Examiner*—Scott R Wilson
(74) *Attorney, Agent, or Firm*—Tung & Associates

(57) ABSTRACT

A fuse structure and method for fabricating same are disclosed. The fuse structure is designed for opening by conventional laser energy application. The fuse structure is characterized by an absence of high stress areas in the surrounding substrate thereby resulting in higher fabrication yields due to lower occurrence of substrate fracturing or other damage occasioned by the opening of the fuse.

19 Claims, 2 Drawing Sheets

FIG. IA (PRIOR ART)

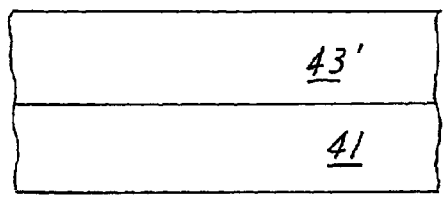
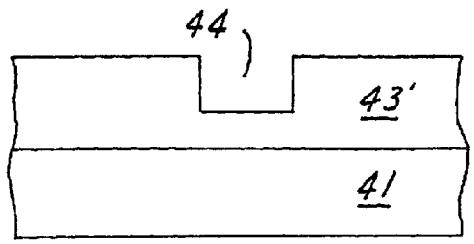
FIG.4A  FIG.4B
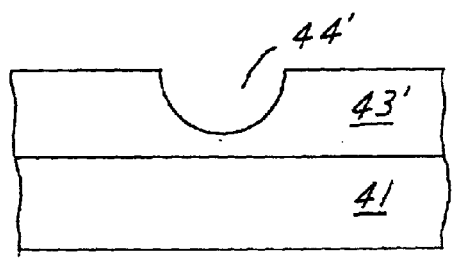
FIG.4C
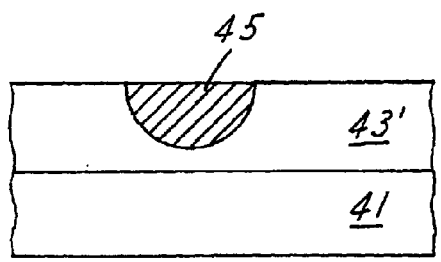
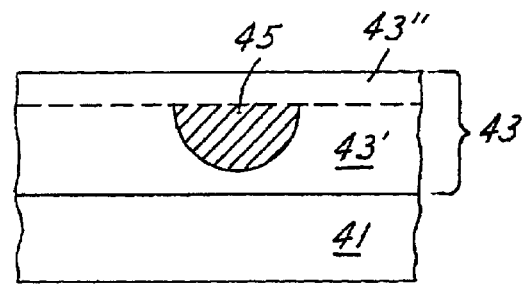
FIG.4D  FIG.4E

LOW STRESS INTEGRATED CIRCUIT FUSIBLE LINK

TECHNICAL FIELD

The present invention is generally related to microchips and their fabrication. More particularly, the invention relates to fusible structures and fabrication processing related to their integration with microchips.

BACKGROUND OF THE INVENTION

Fuse structures are commonly fabricated as part of microchips. Various objectives are accomplished in the application of such fuses. For example, yield management can be improved through redundant structure designs that provide for the selective disabling of defective portions of a circuit in favor of faultless similar portions. Memory structures are but one well known example of such usage wherein columns, rows or entire arrays of memory elements may be fabricated in complete or partial redundancy and wherein faultless structures are substituted for defective structures by strategically placed and severed fuse structures.

Fuse structures also find utility in allowing for flexibility in circuit design or on-chip programmability wherein microchips may be tailored for particular applications by removal, addition, substitution and the like of distinct structures.

Microchip protection during fabrication handling and processing is yet another example of the utility of such fuse structures. In dynamic random access memory, for example, charge accumulation at sensitive structures may be prevented during fabrication processing by providing preferential charge paths through such fuse structures. The fuse structures are severed when fabrication is substantially complete.

The use of such fuse structures is gaining even more importance as system-on-chip manufacturers integrate ever more chip sub-systems and memory devices together in a single monolithic chip design.

Such microchip fuses are routinely fabricated from metallic or polysilicon materials. Any conductive material may be employed. Generally, a narrowed or neck section of a conductive line is provided as a fusible portion of the line whereby severing or opening of the fusible portion is accomplished by applying a controlled pulse of laser energy. The laser energy superheats the fusible portion and vaporizes the material that forms the fuse and leaves a crater in the surrounding area. Opening a fuse in this manner is, although on a small scale, a very violent procedure. Laser blowing of fuses is known to harbor potential for damaging adjacent circuit structures or substrates including, but not limited to, other fuses which may not be desirably opened. Damage to the microchip, including to laterally and vertically adjacent structures, may be caused by reflected or absorbed laser energy. Structural damage to the microchip substrate is known to occur due to absorbed laser energy and localized stresses. For this reason, adjacent fuses or other circuit structures are spaced outside of the lateral area of influence of the laser and are generally not located below a fuse structure. This of course limits the placement density of fuses and adjacent structures. Lasers having relatively long wavelengths such as infrared lasers may be selected to avoid absorption induced damage since conventional substrate material (e.g. silicon) absorbs shorter wavelengths more readily. However, adoption of longer wavelength lasers also necessitates sparse layouts of fuses and adjacent structures since longer wavelengths have inherently less controllability with respect to spot focus of the laser energy. In other words the area of application over which the longer wavelength laser can be controlled is larger than the area over which a shorter wavelength laser can be controlled.

Various attempts have been made at decreasing the spacing between fuses and adjacent structures including other fuses. U.S. Pat. No. 5,420,455 for example discloses laterally placed barriers characterized by high melting point, non-frangible materials. These barriers, it is taught, are not substantially affected by reflected laser energy and present a physical barrier to the adjacent vaporized material thus limiting expansion of the crater therebeyond. Another type of barrier strategy is disclosed in U.S. Pat. No. 6,297,541 wherein a blocking layer is placed vertically beneath the fuse structure. This blocking layer is also described to be a material that is not substantially affected by applied laser energy. Both of these proposed solutions require additional processing steps, require additional lateral or vertical space, and may do nothing to alleviate localized stresses in the microchip substrate.

FIGS. 1A and 1B illustrate prior art fuse structure 10 and damage that occurs to surrounding microchip structure from localized stresses. Fuse structure 10 may typically include a lower substrate layer 11 comprising silicon including circuit structure, metalization or other materials, functionality or purposes. Typically located on top of lower substrate layer 11 is a passivation layer 13 such as silicon dioxide or other suitable material of choice. Fuse 15 is a conductor such as metals including alloys or polysilicon and is typically a narrowed or necked portion of a conductor line. Controlled laser energy 17 is applied to the fuse and the laser energy superheats the fusible portion and vaporizes the fuse material and leaves a crater in the surrounding area as can be seen in FIG. 1B. Localized stresses at the relatively sharp, acute intersections of the sidewalls and bottom of the channel defining the fuse 15 may result in cracking 19 of the surrounding passivation layer 13.

SUMMARY OF THE INVENTION

Therefore, it is one object of the present invention to provide a microchip fuse structure that when opened by laser energy is resistant to damaging adjacent microchip structures.

It is a further object of the present invention to provide a microchip fuse structure that when opened by laser energy is resistant to damaging adjacent microchip structures without the addition of intervening barriers between the fuse and adjacent structures.

It is a further object of the present invention to provide for the above objects of the present invention by implementing conventional microchip fabrication materials and steps.

These objects and advantages of the present invention are realized by a fuse structure comprising an elongate fusible region at least partially defined by a substrate surface that is characterized by the absence of acute transitions. Preferably, the fuse structure is at least partially defined by a substrate surface that is substantially curvilinear in axial cross-section.

BRIEF DESCRIPTION OF THE DRAWINGS

The present invention will now be described, by way of example, with reference to the accompanying drawings, in which:

FIGS. 1A and 1B illustrate sectional views through conventional fuse structure before and after opening of the fuse by laser energy;

DESCRIPTION OF THE PREFERRED EMBODIMENT

Figure 1B:
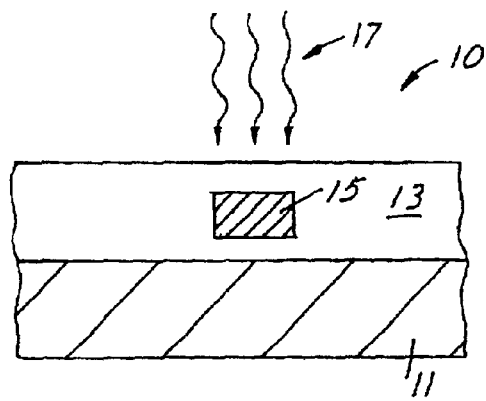
Figure 1B:
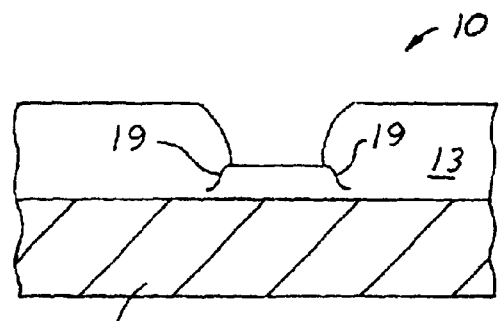
Figure 2A:
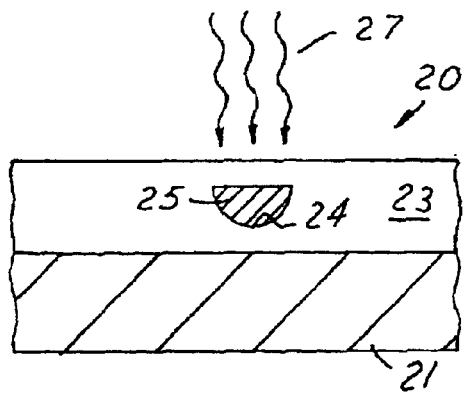
FIG. 2A illustrates a sectional view taken through section line 2A—2A of FIG. 2C of one embodiment of a fuse structure in accordance with the present invention before opening of the fuse by laser energy.
Figure 2B:
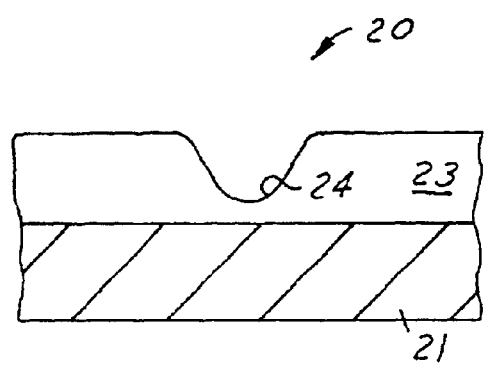
FIG. 2B illustrates the sectional view of the fuse structure of FIG. 2A after opening of the fuse by laser energy.
Figure 2C:
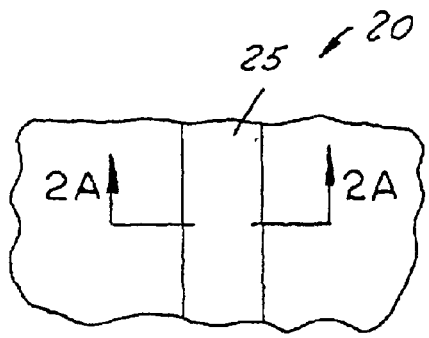
FIG. 2C illustrates a plan view of one embodiment of a fuse structure in accordance with the present invention before opening of the fuse by laser energy.

With reference first to the embodiment of the invention illustrated in FIGS. 2A–2C, a fuse structure 20 includes an elongate fuse 25 which may optionally be a narrowed or necked region of a wider conductor. Fuse 25 is defined by substrate 23 which may comprise any suitable material conventionally utilized in microchip fabrication. Generally, preferred material for substrate 23 includes insulators and dielectrics such as conventional glasses and passivation materials. Substrate 23 may actually comprise several layers of the same or compatible materials. Substrate 23 may be adjacent or on top of a lower substrate layer 21 which may comprise any suitable material conventionally utilized in microchip fabrication. Silicon is a conventional substrate material for substrate 21 and may include active doped regions comprising circuit elements. Insulators and dielectrics such as conventional glasses and passivation materials may also provide substrate 21 and may include conductive traces and plugs. Reference to either of the substrates 23 and 21 is understood to include materials or structures that make up either or both of the substrates 23 and 21. Additionally, reference to substrates or substrate material is understood to mean either or both of the substrates 23 and 21.

With reference specifically to FIG. 2A and a fuse structure according to the present invention prior to opening, substrate 23 has formed therein an elongate channel 24 defining the elongate fuse 25. Channel 24 is characterized by a curvilinear cross section. Channel 24 is arcuate in cross section and may be semicircular.

With reference now to FIG. 2B, the fuse structure described with reference to FIG. 2A is illustrated after opening by application of laser energy. Opening of the fuse is accomplished by conventional application of controlled laser energy 27 to fuse 25. The absence of regions of concentrated stresses (e.g. corners in a conventional trench) results in an undamaged channel 24 and absence of cracks and fissures extending into the substrates.

Figure 3:
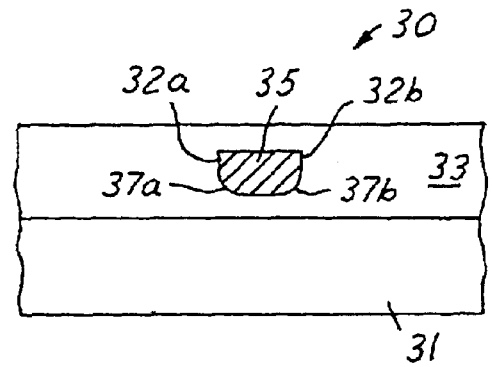
FIG. 3 illustrates a sectional view of an alternate embodiment of a fuse structure in accordance with the present invention before opening of the fuse by laser energy; and, FIGS. 4A–4E illustrate sectional views representing various exemplary steps in a fuse structure manufacturing process in accordance with the present invention.

FIG. 3 illustrates an alternate embodiment of a fuse structure according to the present invention. The sectional view of FIG. 3 is similar to that of the fuse structure of FIG. 2A. Fuse structure 30 includes substrate 31 and 33. Fuse 35 is defined in or by the substrate including a pair of side surfaces 32 and a bottom surface 36. Regions 37 provide smooth, curvilinear transitions between the bottom surface 36 and respective ones of the pair of sidewalls 32. Such embodiment may be considered to have a lower portion and upper portion wherein the lower portion is partially defined by a substantially curvilinear cross section at the corners. As bottom surface 36 becomes smaller and regions 37 become closer together, a single curvilinear transition region joins the pair of side surfaces 32. Such a single transition region may be substantially arcuate or semicircular. Such an embodiment may be considered to be similar to the embodiment of FIG. 2A with additional side surfaces continuing at the top of the semicircular channel. Such embodiment may be considered to have a lower portion and upper portion wherein the lower portion is characterized by a substantially curvilinear cross section. Additionally, the pair of side surfaces 32 may be inclined or sloped away from the center to form a V-shaped channel having a curvilinear transition at the valley.

Turning now to FIGS. 4A–4E an exemplary novel process for yielding a fuse structure according to the present invention is illustrated. In FIG. 4A a lower substrate, for example silicon with active structures or a metallic layer, has deposited thereupon a substrate layer 43' such as a suitable insulator, dielectric or glass. The present example contemplates the deposition of silicon dioxide such as by conventional chemical vapor deposition.

FIG. 4B illustrates trench 44 formation in layer 43' by conventional dry etch processing steps including resist deposition and patterning by masking, exposing, developing and any of a variety of dry/plasma etch processes. Dry etching yield trench 44 having substantially vertical sidewalls and regular, horizontal bottom surface. Also characteristic of the dry etch process are sharp angled intersections of the bottom surface with each of the vertical sidewalls.

Following the dry etch of trench 44 are additional wet etching steps to ease the corners of the trench or as is shown in the section of FIG. 4C to additionally run each of the bottom to sidewall transitions into each other at the bottom surface resulting in a substantially semicircular trench. Wet etching is known to be isotropic in nature. Such isotropic results are generally undesirable when forming microchip structures but are utilized in the present process to achieve the desired results of eased transitions, arcuate or semicircular trenches. Exemplary wet etching techniques include us of hydrofluoric (HF) acids, buffered oxide etcher (BOE) to name a few non-exhaustive examples.

Next, as represented by FIG. 4D, the trench 44 is filled with a conductor to form fuse 45. Generally this will include sputtering a barrier layer of, for example, tantalum or tantalum-nitride, followed by sputtering of a seed layer of the bulk material used for the fill of the trench. Copper is becoming a preferred material for conductors in microchip fabrication and is a preferred material for bulk fill in the present embodiment. Bulk filling of copper is preferably accomplished by copper electroplating. Other conductors may be used for the bulk fill including alloys. Other processes may also be used for the bulk fill including conventional sputtering. Since bulk fill of the trench 44 to establish the fuse 45 will result in overfill, the process is followed up with a planarization step, preferably chemical mechanical processing.

Finally, as represented in FIG. 4E, the upper substrate layer 43 containing the fuse 45 is completed by depositing a cap layer 43". A suitable insulator, dielectric or glass compatible or identical to layer 43' is selected. The present example contemplates the deposition of silicon dioxide such as by conventional chemical vapor deposition.

The previously described steps with respect to FIGS. 4A–4E may be described as a modified damascene process wherein additional wet etching steps are applied to the trench formed in preceding dry etch steps.

The invention has been described with respect to certain preferred embodiments intended to be taken by way of example and not by way of limitation. Certain alternative implementations and modifications may be apparent to one exercising ordinary skill in the art. Therefore, the scope of invention as disclosed herein is to be limited only with respect to the appended claims.

The invention in which an exclusive property or privilege is claimed are defined as follows:

What is claimed is:

1. Microchip fuse structure comprising:
    an elongate fusible region at least partially defined by a substrate surface that is substantially curvilinear in axial cross-section.

2. The microchip fuse structure as claimed in claim 1 wherein said substrate surface is substantially arcuate in axial cross-section.

3. The microchip fuse structure as claimed in claim 1 wherein said substrate surface is substantially semicircular in axial cross-section.

4. The microchip fuse structure as claimed in claim 1 wherein said substrate surface is substantially V-shaped having sloped sidewalls in axial cross-section.

5. The microchip fuse structure as claimed in claim 1 wherein said substrate surface has a bottom surface and a pair of sidewalls wherein the bottom surface smoothly transitions into said sidewalls.

6. The microchip fuse structure as claimed in claim 1 wherein said substrate surface includes a pair of sidewalls which smoothly transition into one another by a substantially semicircular surface.

7. Microchip fuse structure comprising: an elongate region of conductive material;
    a substrate in proximity to said region of conductive material;
    said substrate defining a boundary immediately adjacent said region of conductive material, said boundary defined by at least two substantially planar surfaces wherein adjacent ones of said at least two substantially planar surfaces are curvilinearly conjoined;
    said at least two substantially planar surfaces include a bottom surface and a pair of opposite side surfaces.

8. The microchip fuse structure as claimed in claim 7 wherein said boundary is further defined by at least one arcuate surface wherein said at least two substantially planar surfaces are curvilinearly conjoined by said at least one arcuate surface.

9. The microchip fuse structure as claimed in claim 8 wherein said at least two substantially planar surfaces include a bottom surface and a pair of opposite side surfaces, and said at least one arcuate surface includes a first arcuate surface joining said bottom surface and one of said pair of opposite sidewalls and a second arcuate surface joining said bottom surface and the other of said pair of opposite sidewalls.

10. Microchip fuse structure comprising:
    an elongate region of conductive material;
    a substrate in proximity to said region of conductive material;
    said substrate having a substrate surface immediately adjacent said region of conductive material that is substantially semi-circular in axial cross-section, said substrate surface characterized by the absence of acute transitions.

11. The microchip fuse structure as claimed in claim 10 wherein said substrate surface immediately adjacent said region of conductive material is substantially V-shaped having sloped sidewalls in axial cross-section.

12. Microchip fuse structure comprising:
    an elongate fusible region at least partially defined by a substrate surface that is substantially semicircular in axial cross-section.

13. The microchip fuse structure as claimed in claim 12 wherein said substrate surface is substantially arcuate in axial cross-section.

14. The microchip fuse structure as claimed in claim 12 wherein said substrate surface is substantially V-shaped having sloped sidewalls in axial cross-section.

15. Microchip fuse structure comprising:
    an elongate fusible region at least partially defined by a substrate surface that is substantially curvilinear in axial cross-section, said substrate surface has a bottom surface and a pair of sidewalls wherein the bottom surface smoothly transitions into said sidewalls.

16. The microchip fuse structure as claimed in claim 15 wherein said substrate surface is substantially arcuate in axial cross-section.

17. The microchip fuse structure as claimed in claim 15 wherein said substrate surface is substantially semicircular in axial cross-section.

18. The microchip fuse structure as claimed in claim 15 wherein said substrate surface is substantially V-shaped having sloped sidewalls in axial cross-section.

19. The microchip fuse structure as claimed in claim 15 wherein said substrate surface includes a pair of sidewalls which smoothly transition into one another by a substantially semicircular surface.

\* \* \* \* \*